United States Patent
Harada et al.

(10) Patent No.: US 7,972,979 B2
(45) Date of Patent: Jul. 5, 2011

(54) SUBSTRATE PROCESSING METHOD AND SUBSTRATE PROCESSING APPARATUS

(75) Inventors: Toru Harada, Fuchu-machi (JP); Masayoshi Minami, Toyama (JP)

(73) Assignee: Hitachi Kokusai Electric, Inc., Tokyo (JP)

(*) Notice: Subject to any disclaimer, the term of this patent is extended or adjusted under 35 U.S.C. 154(b) by 0 days.

(21) Appl. No.: 12/857,942

(22) Filed: Aug. 17, 2010

(65) Prior Publication Data
US 2011/0065288 A1 Mar. 17, 2011

(30) Foreign Application Priority Data

Sep. 16, 2009 (JP) ................. 2009-214452
Jun. 14, 2010 (JP) ................. 2010-135000

(51) Int. Cl.
*H01L 21/469* (2006.01)
(52) U.S. Cl. ........ 438/787; 438/775; 438/791; 438/795; 438/E21.293; 216/385
(58) Field of Classification Search .......... 438/424–428, 438/435, 775, 787, 791–795; 216/385
See application file for complete search history.

(56) References Cited

U.S. PATENT DOCUMENTS

2008/0014711 A1* 1/2008 Choi et al. ............ 438/424
2008/0305611 A1* 12/2008 Hirota ............... 438/425

FOREIGN PATENT DOCUMENTS

JP 10-321719 12/1998

* cited by examiner

*Primary Examiner* — Dung A. Le
(74) *Attorney, Agent, or Firm* — Brundidge & Stanger, P.C.

(57) ABSTRACT

Provided is a substrate processing method comprising: loading a substrate, on which polysilazane is applied, into a substrate process chamber; maintaining an inside of the substrate process chamber, into which the substrate is loaded, in water vapor atmosphere and depressurization atmosphere at a temperature of 400° C.; performing a first heat treatment process on the substrate in a state where the inside of the substrate process chamber is maintained in the water vapor atmosphere and the depressurization atmosphere at the temperature of 400° C.; next, increasing an inner temperature of the substrate process chamber from the temperature of 400° C. in the first heat treatment process to a temperature ranging from 900° C. to 1000° C.; and performing a second heat treatment process on the substrate in a state where the inside of the substrate process chamber is maintained in water vapor atmosphere and depressurization atmosphere at the temperature ranging from 900° C. to 1000° C.

4 Claims, 6 Drawing Sheets

SUBSTRATE PROCESSING METHOD AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application Nos. 2009-214452, filed on Sep. 16, 2009, and 2010-135000, filed on Jun. 14, 2010, in the Japanese Patent Office, the entire contents of which are hereby incorporated by reference.

BACKGROUND OF THE INVENTION

1. Field of the Invention

The present invention relates to a substrate processing technology for forming an insulating film on a part such as a device isolation groove, for example, to a substrate processing method and a substrate processing apparatus, which are effective after a structure such as an oxide film is formed on a semiconductor substrate (for example, semiconductor wafer) on which a semiconductor integrated circuit (referred to as an 'IC' hereinafter) is formed and installed, or to a manufacturing method and a manufacturing apparatus for a semiconductor device.

2. Description of the Related Art

In manufacturing integrated circuits (ICs), as ICs are highly integrated, miniaturization of circuit devices such as transistors constituting the ICs is required. For this reason, as a device isolation forming method for ICs, a shallow trench isolation (STI) method having an excellent dimension control property and providing a small occupation area is currently used. In the STI method, after a groove is formed in a semiconductor substrate, an atmospheric pressure chemical vapor deposition (CVD) method using tetraethoxysilane (TEOS) and $O_3$ (ozone), or a plasma CVD method using TEOS is used to embed an insulating film into the formed groove, thereby forming a device isolation region.

However, in recent years, high integration of ICs is gradually increased, an aspect ratio (depth of groove/width of groove), which is a ratio of the depth of a device isolation groove to the width thereof, is increased. For this reason, in the atmospheric pressure CVD method used in the related art, it is difficult to embed an insulating film in a device isolation groove without forming a void or a seam. To address a defect such as the void, for example, a filling technology using a spin on dielectric (SOD) method, in which an applied film (PSZ: polysilazane) of a perhydro polysilazane solution is formed through spin coating to be deposited within a device, and then, an oxidation/polymerization reaction is promoted through a high temperature water vapor oxidation process to form an insulating film, is being developed.

However, in a case of an insulating film formed through the high temperature water vapor oxidation process, it is difficult to remove carbon or hydrogen as impurities included in polysilazane for obtaining a dense film. As a method of forming a film of this polysilazane, in Patent Document 1 below, a method in which polysilazane is applied on a substrate, then, a first heat treatment is performed at a temperature ranging from 100° C. to 250° C. to evaporate organic solvent, and then, a second heat treatment is performed, for example, at 400° C. to cure the applied polysilazane film is disclosed.

[Patent Document 1]
Japanese Unexamined Patent Application Publication No. H10-321719

SUMMARY OF THE INVENTION

An object of the present invention is to provide a manufacturing method and a manufacturing apparatus for a semiconductor device, which can embed an insulating film in a recess part, for example, such as a device isolation groove having a small width with a high aspect ratio, and provide a substrate processing method (heat treatment method) and a substrate processing apparatus (heat treatment apparatus), which further improve the technology disclosed in Patent Document 1 as described above, to promote the formation of an oxide film ($SiO_2$) of polysilazane, for example, in an device isolation groove and improve the film quality (etching resistance) of an insulating film.

According to an aspect of the present invention, there is provided a substrate processing method comprising: loading a substrate, on which polysilazane is applied, into a substrate process chamber; maintaining an inside of the substrate process chamber, into which the substrate is loaded, in water vapor atmosphere and depressurization atmosphere at a temperature ranging from 350° C. to 450° C.; performing a first heat treatment process on the substrate in a state where the inside of the substrate process chamber is maintained in the water vapor atmosphere and the depressurization atmosphere at the temperature ranging from 350° C. to 450° C.; next, increasing an inner temperature of the substrate process chamber from the temperature ranging from 350° C. to 450° C. in the first heat treatment process to a temperature ranging from 900° C. to 1000° C.; and performing a second heat treatment process on the substrate in a state where the inside of the substrate process chamber is maintained in water vapor atmosphere and depressurization atmosphere at the temperature ranging from 900° C. to 1000° C.

According to another aspect of the present invention, there is provided a substrate processing apparatus comprising: a substrate process chamber configured to accommodate a substrate; a heater configured to heat the substrate accommodated in the substrate process chamber; a water vapor generator; a water vapor supply pipe configured to supply water vapor from the water vapor generator into the substrate process chamber; an exhaust pipe configured to exhaust atmosphere in the substrate process chamber; and a control part, wherein the control part executes a control to perform a first heat treatment process on the substrate in a state where an inside of the substrate process chamber is maintained in water vapor atmosphere and depressurization atmosphere at a temperature ranging from 350° C. to 450° C.; to increase an inner temperature of the substrate process chamber from the temperature ranging from 350° C. to 450° C. in the first heat treatment process to a temperature ranging from 900° C. to 1000° C.; to perform a second heat treatment process on the substrate in a state where the inside of the substrate process chamber is maintained in water vapor atmosphere and depressurization atmosphere at the temperature ranging from 900° C. to 1000° C.; and then, to perform a third heat treatment process on the substrate in a state where the inside of the substrate process chamber is maintained in inert gas atmosphere and depressurization atmosphere at the temperature ranging from 900° C. to 1000° C.

DETAILED DESCRIPTION OF THE PREFERRED EMBODIMENTS

Hereinafter, embodiments of the present invention will be described with reference to the accompanying drawings.

Figure 1:
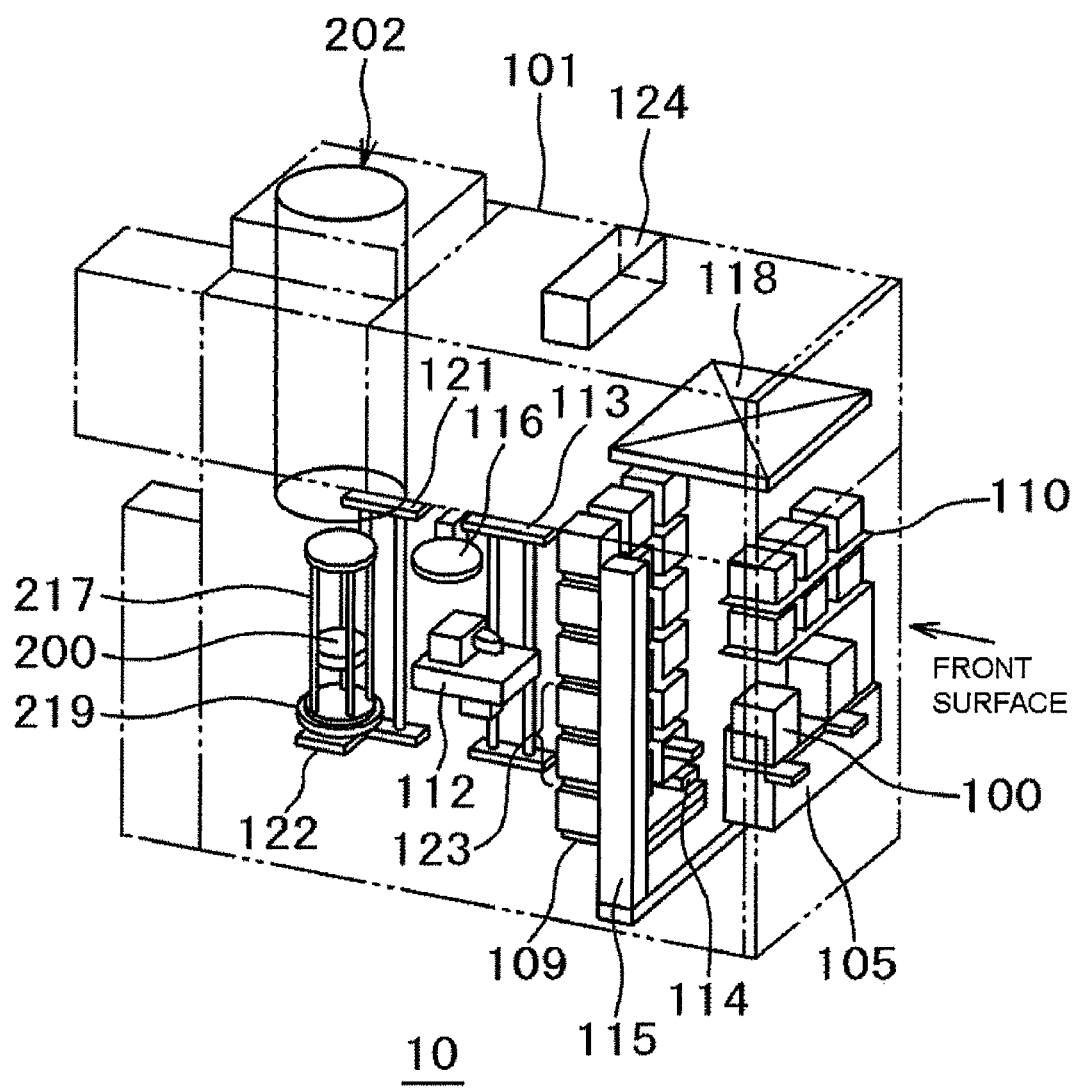
FIG. 1 is a perspective view illustrating a batch type vertical heat treatment apparatus according to an embodiment of the present invention.

FIG. 1 is a perspective view illustrating a batch type vertical heat treatment apparatus as a substrate processing apparatus according to an embodiment of the present invention.

Figure 2:
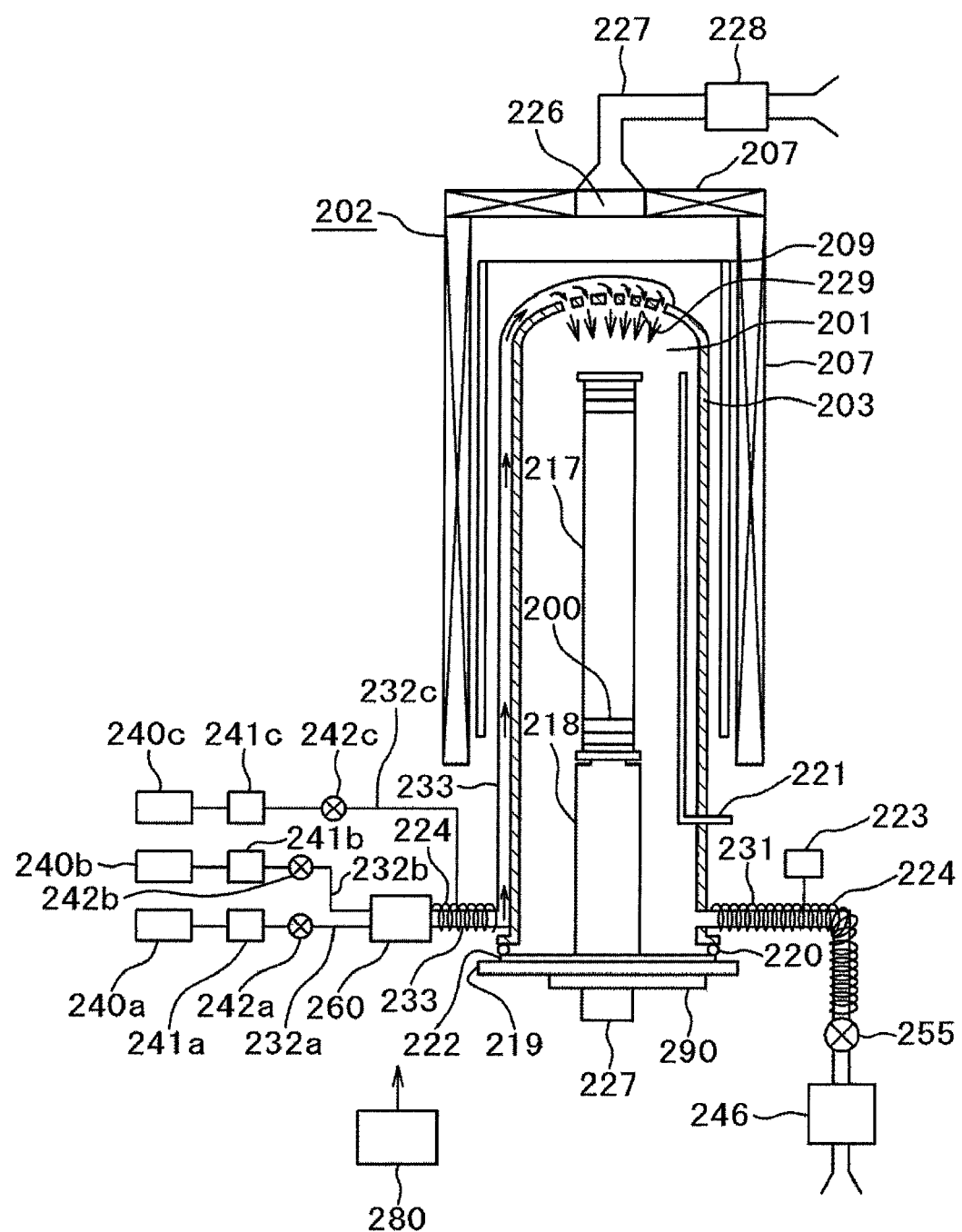
FIG. 2 is a vertical cross-sectional view illustrating a process furnace of a batch type vertical heat treatment apparatus according to an embodiment of the present invention.

FIG. 2 is a vertical cross-sectional view illustrating a process furnace of the batch type vertical heat treatment apparatus according to the embodiment of the present invention.

[Overview of Substrate Processing Apparatus]

First, referring to FIG. 1 and FIG. 2, a substrate processing apparatus 10 according to the current embodiment will be described schematically.

As shown in FIG. 1, a cassette stage 105 is installed at a front surface side in a housing 101 of the substrate processing apparatus 10. The cassette stage 105 is provided such that cassettes 100 as substrate containers are delivered between the cassette stage 105 and an external carrying device (not shown). A cassette carrying device 115 is installed at the rear side of the cassette stage 105. At the rear side of the cassette carrying device 115, a cassette shelf 109 for storing the cassettes 100 is installed. At the upper side of the cassette stage 105, a preliminary cassette shelf 110 for storing the cassettes 100 is installed. A cleaning unit 118 is installed at the upper side of the preliminary cassette stage 110. The cleaning unit 118 circulates clean air through the inside of the housing 101.

At the rear upper side of the housing 101, a process furnace 202 is installed. A boat elevator 121 is installed under the process furnace 202. The boat elevator 121 moves upward and downward a boat 217 charged with wafers 200 between the inside and outside of the process furnace 202. The boat 217 is a substrate holding unit configured to hold the wafers 200 to be horizontally oriented and arranged in multiple stages. A seal cap 219 as a cap body for closing the lower end of the process furnace 202 is attached to the boat elevator 121. The seal cap 219 vertically supports the boat 217.

Between the boat elevator 121 and the cassette shelf 109, a wafer transfer device 112 configured to carry the wafer 200 is installed. At a side of the boat elevator 121, a furnace port shutter 116 for air-tightly closing the lower end of the process furnace 202 is disposed. When the boat 217 is disposed out of the process furnace 202, the furnace port shutter 116 can close the lower end of the process furnace 202.

The cassette 100 loaded with the wafers 200 is carried from the external carrying device (not shown) to the cassette stage 105. In addition, the cassette 100 is carried by the cassette carrying device 115 from the cassette stage 105 to the cassette shelf 109 or to the preliminary cassette stage 110. At the cassette shelf 109, a transfer shelf 123 configured to accommodate the cassette 100 that is carried by the wafer transfer device 112 is disposed. The cassette 100 configured to transfer wafers 200 to the boat 217 is transferred to the transfer shelf 123 by the cassette carrying device 115. When the cassette 100 is transferred to the transfer shelf 123, the wafers 200 are transferred by the wafer transfer device 112 from the transfer shelf 123 to the boat 217 in a lowered state.

When a predetermined number of wafers 200 are transferred to the boat 217, the boat elevator 121 inserts the boat 217 into the process furnace 202, and the seal cap 219 air-tightly closes the process furnace 202. In the air-tightly closed process furnace 202, the wafers 200 are heated, and simultaneously, processing gas is supplied into the process furnace 202, a process such as heating is performed on the wafers 200.

When the process on the wafers 200 is completed, in the reverse sequence to the above-described sequence, the wafers 200 are transferred by the wafer transfer device 112 from the boat 217 to the cassette 100 of the transfer shelf 123, and the cassette 100 is transferred by the cassette carrying device 115 from the transfer shelf 123 to the cassette stage 105 and carried out of the housing 101 by the external carrying device (not shown).

When the boat 217 is in the lowered state, the furnace port shutter 116 air-tightly closes the lower end of the process furnace 202 to prevent external air from being sucked into the process furnace 202.

[Process Furnace]

As shown in FIG. 1 and FIG. 2, the substrate processing apparatus 10 affecting the current embodiment includes the process furnace 202, and the process furnace 202 with a cylindrical shape includes a reaction tube (reactor tube) 203 made of a quartz material or a silicon carbide material, and a liner tube 209. The reaction tube 203 is a reaction container configured to receive and heat substrates (the wafers 200 in the current embodiment). The reaction tube 203 is installed in a concentric circle shape at the inside of a cylindrical heating part (a resistance heater 207 in the current embodiment).

The reaction tube 203 has a close upper end, and an open lower end of the reaction tube 203 is air-tightly closed by the seal cap 219 through a sealing member (an O-ring 220 in the current embodiment). The liner tube 209 is made of a heat-resistant material, for example, such as quartz ($SiO_2$) or silicon carbide (SiC), and has a cylindrical shape with open upper and lower ends, and is a uniform heat tube for uniformly maintaining an inner temperature of a substrate process chamber 201. The liner tube 209 is disposed between the heater 207 and the reaction tube 203.

Parts such as the heater 207, the reaction tube 203, the liner tube 209, and the seal cap 219 constitute the process furnace 202. In addition, the reaction tube 203 and the seal cap 219 forms the substrate process chamber 201. Above the seal cap 219, a substrate holding member (the boat 217) is installed through a quartz cap 218. The quartz cap 218 is a holding body configured to hold the boat 217. The boat 217 is inserted into the process furnace 202 from an open lower end of the process furnace 202. At the boat 217, a plurality of wafers 200 to be batch processed, each is horizontally held and piled in multiple stages in a tube axial direction (in a vertical direction). The heater 207 heats the wafers 200 placed inside the process furnace 202 to a predetermined temperature.

The seal cap 219 contacts the lower end of the reaction tube 203 from the lower side in the vertical direction. For example, the seal cap 219 is made of a metal such as stainless steel, and has a circular plate shape. On the upper surface of the seal cap 219, the O-ring 220 is installed as a seal member contacting the lower end of the reaction tube 203.

As shown in FIG. 2, a base 222 may be installed above the seal cap 219. For example, the base 222 is made of a heat-resistant material such as quartz, and has a circular plate shape. On a surface of the base 222, the O-ring 220 is installed as a seal part contacting the lower end of the reaction tube 203. Since the base 222 without a metal material is used, a metal contamination in the reaction tube 203 can be reduced.

In addition, since a seal cap heater 290 configured to heat the seal cap 219 is provided, a control for maintaining a desired temperature is executed to suppress dew condensation on the surface of the base 222.

At the lower side of the seal cap 219, a boat rotation mechanism 227 configured to rotate the boat 217 is installed. A rotation shaft of the boat rotation mechanism 227 passes through the seal cap 219, and is connected to the boat 217 through the quartz cap 218, and is configured to rotate the boat 217 to rotate the wafers 200. The seal cap 219 is configured to be vertically moved upward by the boat elevator 121 as an elevating facility vertically installed at the outside of the reaction tube 203, and thus, the boat 217 can be loaded to and unloaded from the substrate process chamber 201. The boat rotation mechanism 227 and the boat elevator 121 are electrically connected with a driving control part 285 (refer to FIG. 3), and is configured to execute a control at a desired time for performing a desired operation.

For example, the boat 217 is made of a heat-resistant material such as quartz and silicon carbide, and is configured to hold a plurality of wafers 200 in a state where the wafers 200 are horizontally positioned and arranged in multiple stages with the centers of the wafers 200 being aligned with each other. At the lower part of the boat 217, the quartz cap 218 is installed, or a plurality of insulating plates as an insulating member made of a heat-resistant material such as quartz and silicon carbide and having a circular plate shape are horizontally positioned and arranged in multiple stages, so as to make heat transfer from the heater 207 to the seal cap 219 the manifold 209 difficult.

A temperature monitor 221 as a temperature detector is installed inside the reaction tube 203. The heater 207 and the temperature monitor 221 are electrically connected to a temperature control part 286, and power to the heater 207 is controlled based on temperature information detected by the temperature monitor 221 for obtaining desired temperature distribution at the inside of the substrate process chamber 201 at a desired time.

At the heater 207 on the upper side of the reaction tube 203, an exhaust hole 226 for exhausting the atmosphere of a space between the reaction tube 203 and the heater 207 is installed. The exhaust hole 226 is connected with an exhaust pipe 227, and a blower 228 is installed on the way of the exhaust pipe 227. The blower 228 exhausts the atmosphere of the space between the reaction tube 203 and the heater 207. As the atmosphere is exhausted from the space between the reaction tube 203 and the heater 207, the boat 217 or the wafers 200 in the reaction tube 203 can be cooled within a short time. After the wafers 200 are heated, the atmosphere of the space between the reaction tube 203 and the heater 207 is exhausted to cool the wafers 200.

Figure 3:
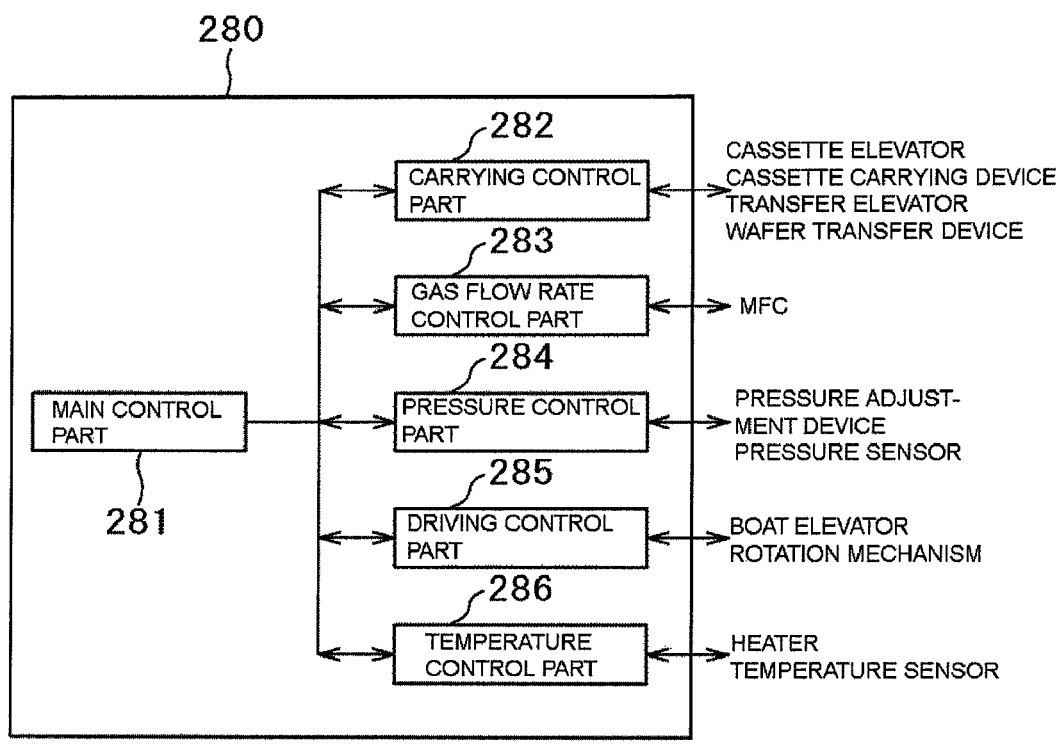
FIG. 3 is a block diagram illustrating a control part of a batch type vertical heat treatment apparatus according to an embodiment of the present invention.

As shown in FIG. 3, a carrying control part 282, a gas flow rate control part 283, a pressure control part 284, a driving control part 285, and a temperature control part 286, together with a manipulation part (not shown) and an input/output part (not shown), are electrically connected to a main control part 281 configured to entirely control the substrate processing apparatus 10. The carrying control part 282, the gas flow rate control part 283, the pressure control part 284, the driving control part 285, the temperature control part 286, and the main control part 281 constitute a controller (control part) 280. Each of the control parts including the main control part 281 includes, as a hardware configuration, a central processing unit (CPU) and a memory.

[Water Vapor Supply Part]

As shown in FIG. 2, a gas supply pipe 233 as a water vapor supply path configured to supply water vapor ($H_2O$) to the substrate process chamber 201 is installed at the outside of the reaction tube 203 from the lower part of the reaction tube 203 to the upper part thereof along the stacking direction of the wafers 200. An end of the gas supply pipe 233 reaches the upper part of the reaction tube 203, and the other end of the gas supply pipe 233 is connected, at the lower side of the reaction tube 203, to a water vapor generator 260. At the upper part of the reaction tube 203, a plurality of gas supply holes 229 are installed. Water vapor generated from the water vapor generator 260 moves upward from the lower part of the reaction tube 203 through the inside of the gas supply pipe 233, and arrives at the upper part of the reaction tube 203, and is supplied through the plurality of gas supply holes 229 into the substrate process chamber 201.

At the lower part of the reaction tube 203, the gas supply pipe 233 is bent 90 degrees and connected to the water vapor generator 260. The water vapor generator 260 is connected with a hydrogen gas supply pipe 232a and an oxygen gas supply pipe 232b. At the hydrogen gas supply pipe 232a, sequentially from an upstream side, a hydrogen gas supply source 240a, a mass flow controller (MFC; flow rate control device) 241a, and an open/close valve 242a are installed. At the oxygen gas supply pipe 232b, sequentially from an upstream side, an oxygen gas supply source 240b, an MFC 241b, and an open/close valve 242b are installed. The water vapor generator 260 uses hydrogen gas supplied from the hydrogen gas supply source 240a, and oxygen gas supplied from the oxygen gas supply source 240b, to generate water vapor.

On the way of the gas supply pipe 233, an inert gas supply pipe 232c is connected thereto. At the inert gas supply pipe 232c, sequentially from an upstream side, an inert gas supply source 240c, an MFC 241c, and an open/close valve 242c are installed.

The MFCs 241a, 241b, and 241c are electrically connected with the gas flow rate control part 28, and are configured such that the flow rate of supplied gas reaches a desired value and is controlled at a desired time.

[Exhaust Part]

The lower side of the reaction tube 203 is connected with an end of a gas exhaust pipe 231 configured to exhaust gas from the substrate process chamber 201. The other end of the gas exhaust pipe 231 is connected to a vacuum pump 246 (exhaust device) through an auto pressure controller (APC) valve 255. The inside of the substrate process chamber 201 is evacuated by the vacuum pump 246. In addition, the APC valve 255 is an open/close valve that is open and closed to evacuate the substrate process chamber 201 and stop the evacuation thereof, and the APC valve 255 is a pressure adjustment valve that controls an opening degree of a valve to adjust pressure.

In addition, a pressure sensor 223 is installed as a pressure detector at the upstream side of the APC valve 255. As such, a vacuum exhaust is performed such that an inner pressure of the substrate process chamber 201 reaches a predetermined pressure (degree of vacuum). Through the APC valve 255, the substrate process chamber 201 and the pressure sensor 223 are electrically connected to a pressure control part 284 (refer to FIG. 3), and the pressure control part 284 is configured to control, based on a pressure detected by the pressure sensor 223, the APC valve 255 at a desired time such that the APC valve 255 brings the pressure in the substrate process chamber 201 to reach a desired pressure.

In addition, a heater 224 configured to heat the gas supply pipe 233 and the gas exhaust pipe 231 is provided, and is controlled to obtain a desired temperature for suppressing dew condensation in a pipe.

[Control Part]

The controller (control part) 280 is electrically connected to each component of the substrate processing apparatus 10, such as the MFC 241a, 241b, and 241c, the valves 242a, 242b, and 242c, the water vapor generator 260, the APC valve 255, the temperature monitor 221, the heater 207, the heater 224, the pressure sensor 223, the vacuum pump 246, the boat rotation mechanism 227, the boat elevator 121, and the seal cap heater 290.

The controller 280 controls, based, on programs and recipes, each component of the substrate processing apparatus 10, such as the flow rate adjustment operation of the MFC 241a, 241b, and 241c, the open/close operation of the valves 242a, 242b, and 242c, the activation and stop of the water vapor generator 260, the open/close and pressure adjustment operations of the APC valve 255, the temperature adjustment operations of the heaters 207 and 224, the activation and stop of the vacuum pump 246, the rotation speed adjustment of the boat rotation mechanism 227, the raising/lowering control of the boat elevator 121, and the seal cap heater 290.

Figure 5:
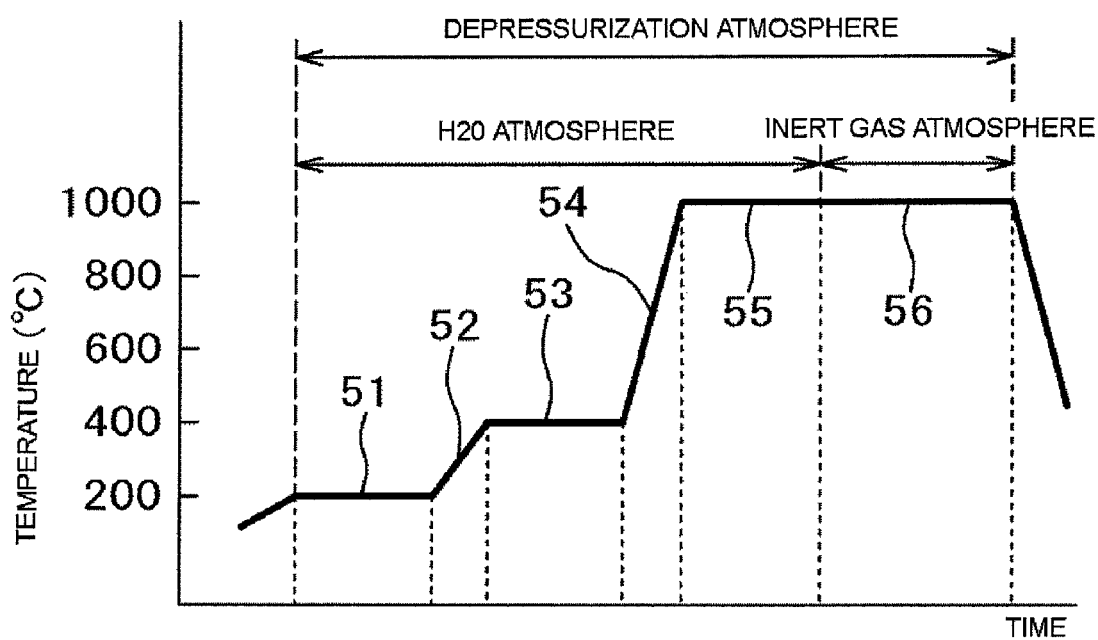
FIG. 5 is a graph illustrating a heat treatment process affecting an embodiment of the present invention.

An embodiment using the substrate processing apparatus 10 as shown in FIG. 1 will now be described with reference to FIG. 5. FIG. 5 is a graph illustrating a heat treatment process according to an embodiment of the present invention. A control of the control part 280 for the substrate processing apparatus 10 according to the current embodiment is as follows.

(1) Substrate Loading Process to the Substrate Process Chamber 201

First, the inner temperature of the substrate process chamber 201 is maintained at a range from 100° C. to 250° C. to supply inert gas from the inert gas supply source 240c into the substrate process chamber 201, and the atmosphere of inert gas such as nitrogen is formed in the substrate process chamber 201 under a pressure ranging from 96000 Pa to 102500 Pa. In detail, for example, the inner temperature of the substrate process chamber 201 is set to 200° C., and the pressure thereof is set to 100000 Pa.

Figure 4:
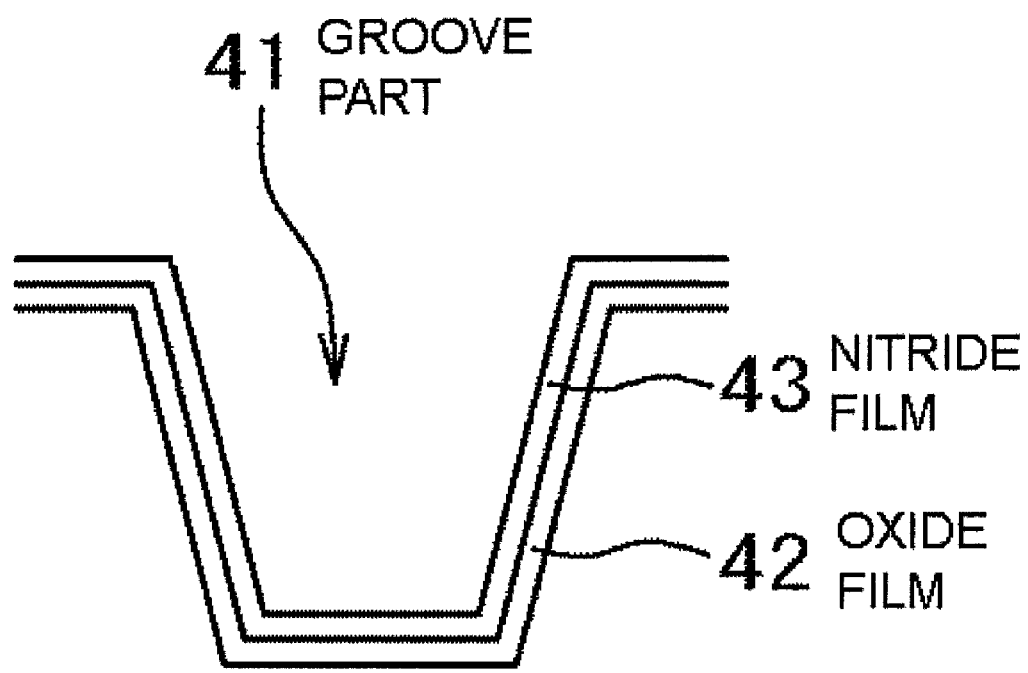
FIG. 4 is a schematic view illustrating a silicon nitride film formed on a groove part on a substrate.

Next, as shown in FIG. 4, on a surface of a substrate having a groove part 41 in which a silicon nitride film 43 is formed, polysilazane is applied, and wafers 200 treated through a bake process with a range from about 100° C. to about 250° C. are charged to the boat 217 by the wafer transfer device 112, and the boat 217 charged with the wafers 200 is loaded into the substrate process chamber 201 by the boat elevator 121. FIG. 4 is a schematic view illustrating a silicon nitride film formed on a groove part on a substrate. In FIG. 4, a silicon oxide film 42 is formed to improve adhesiveness of a silicon substrate with a silicon oxide film formed using polysilazane.

The bake process is used to evaporate organic solvent that is used when polysilazane is applied, and, if the substrate processing apparatus 10 is a batch type apparatus as in the present embodiment, the bake process is performed in a separate apparatus from the substrate processing apparatus 10. If the substrate processing apparatus 10 is a single wafer apparatus, the bake process can be performed in the substrate processing apparatus 10. The reason why organic solvent is mixed with polysilazane is to obtain sufficient fluidity such that the polysilazane gets into a narrow groove. The bake process is denoted by reference numeral 51 in FIG. 5, in detail, for example, the bake process is performed in depressurization atmosphere (6000 to 60000 Pa) and water vapor atmosphere (water vapor partial pressure of 600 to 60000 Pa).

(2) (First) Heat Treatment of Polysilazane Film

After the boat 217 charged with the wafers 200 is loaded into the substrate process chamber 201, the temperature of the substrate process chamber 201 is maintained at a range from 350° C. to 450° C. In addition, the water vapor generator 260 is used to generate water vapor to be supplied into the substrate process chamber 201, and simultaneously, nitrogen gas that is inert gas is supplied from the inert gas supply source 240c into the substrate process chamber 201. In this way, the inner pressure of the substrate process chamber 201 is maintained at 6000 Pa to 60000 Pa, and the partial pressure of water vapor is maintained at 600 Pa to 60000 Pa (water concentration of 10% to 100%). At these temperature and pressure, for 5 minutes to 120 minutes, a heat treatment is performed on the wafers 200. In detail, for example, the inner temperature of the substrate process chamber 201 is maintained at about 400° C., and the pressure thereof is maintained at 53200 Pa, and the partial pressure of water vapor is maintained at 45800 Pa (water concentration of 86%), to heat-treat the wafers 200 for 30 minutes. Through the heat treatment under these water vapor atmosphere and depressurization atmosphere, polysilazane films applied on the wafers 200 are cured. This (first) heat treatment of a polysilazane film is shown as a heat treatment 53 in FIG. 5.

The heat treatment 53 is performed, for example, in water vapor atmosphere including oxygen and water. Due to the presence of the water, the water functions as a catalyst to replace nitrogen and hydrogen with oxygen, and Si—O bonding that is thermally strong is formed. The polysilazane film heat-treated in this manner has the Si—O bonding as a main structure, and does not include many alkyl groups. Thus, unlike a related art organic SOG, the polysilazane film has high heat resistance.

(3) (Second) Heat Treatment of Polysilazane Film

Next, the inner temperature of the substrate process chamber 201 is increased from a temperature of the (first) heat treatment of a polysilazane film, for example, from about 400° C. to a temperature ranging from 900° C. to 1000° C. In addition, water vapor is supplied from the water vapor generator 260 into the substrate process chamber 201, and simultaneously, nitrogen gas that in inert gas is supplied from the inert gas supply source 240c into the substrate process chamber 201. In this way, the inner pressure of the substrate process chamber 201 is maintained at 6000 Pa to 60000 Pa, and the partial pressure of water vapor is maintained at 600 Pa to 60000 Pa (water concentration of 10% to 100%). At these temperature and pressure, for 5 minutes to 120 minutes, a (second) heat treatment is performed on the wafers 200. In detail, in the current embodiment, the inner temperature of the substrate process chamber 201 is increased for 120 minutes from 400° C. to 1000° C. substantially in a straight line to be maintained at about 1000° C., and the pressure thereof is maintained at 53200 Pa, and the partial pressure of water vapor is maintained at 45800 Pa (water concentration of 86%), to heat-treat the wafers 200 for 30 minutes. A process of increasing the temperature from 400° C. to 1000° C. is denoted by reference numeral 54 in FIG. 5. In addition, this (second) heat treatment of a polysilazane film is shown as a heat treatment 55 in FIG. 5.

Through the heat treatment 55 in these water vapor atmosphere and depressurization atmosphere, carbon, hydrogen, and nitrogen that are impurities of a polysilazane film present at the deepest part in a groove on the wafer 200 can be removed. As a result, the polysilazane film is sufficiently cured and densified, so that the polysilazane film, as an insulating film, can have acceptable wet etch rate (WER) characteristics. WER significantly depends on a final annealing temperature, and decreases as temperature increases.

In addition, in FIG. 5, after the heat treatment 55, the inner temperature of the substrate process chamber 201 is maintained at a range from 900° C. to 1000° C., and, in depressurization atmosphere and inert atmosphere, a third heat treatment 56 is performed for 30 minutes. Through the third heat treatment 56, impurities are removed from the polysilazane film to achieve densification.

(4) Substrate Unloading Process from the Substrate Process Chamber 201

Next, the inner temperature of the substrate process chamber 201 is maintained at about 200° C. in the atmosphere of inert gas such as nitrogen under the atmospheric pressure, and the boat 217 charged with the heat-treated wafers 200 is unloaded from the substrate process chamber 201 by the boat elevator 121.

Figure 6:
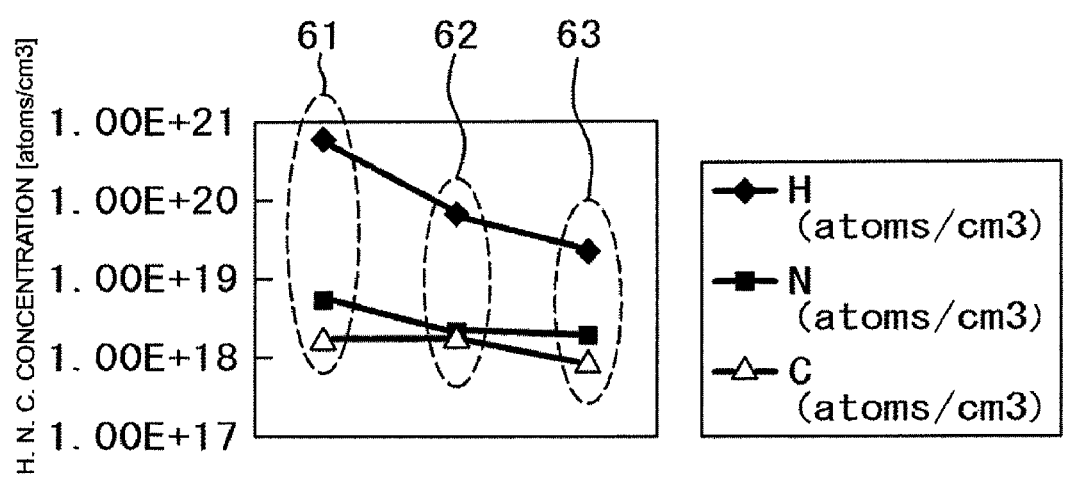
FIG. 6 is a graph illustrating an impurity reduction effect according to the present invention.

In FIG. 6, after a heat treatment according to the present invention, a measurement result (secondary ion mass spectrometry (SIMS) analysis result) for impurities in a polysilazane film is shown. FIG. 6 is a graph illustrating an impurity reduction effect according to the present invention. In FIG. 6, a vertical axis denotes concentrations of hydrogen (H), nitrogen (N) and carbon (C). Reference numeral 61 denotes a comparison example 1, in which the (first) heat treatment of a polysilazane film (the heat treatment 53 in FIG. 5) is performed at 400° C., and then, a heat treatment is performed on the polysilazane film in water vapor atmosphere and depressurization atmosphere at 700° C. Reference numeral 62 denotes a comparison example 2, in which the (first) heat treatment of a polysilazane film (the heat treatment 53 in FIG. 5) is performed at 400° C., then, a heat treatment is performed on the polysilazane film in water vapor atmosphere and depressurization atmosphere at 700° C., and then, a heat treatment is performed at 1000° C. in depressurization atmosphere and the atmosphere of nitrogen gas that is inert gas. Reference numeral 63 denotes a heat treatment, according to the present invention, in which the (first) heat treatment of a polysilazane film (the heat treatment 53 in FIG. 5) is performed at 400° C., and then, the (second) heat treatment of the polysilazane film (the heat treatment 55 in FIG. 5) is performed in water vapor atmosphere and depressurization atmosphere at 1000° C.

From the SIMS analysis result of FIG. 6, it turns out that the heat treatment 63 according to the present invention, in other words, a high temperature WET treatment in which a heat treatment is performed in water vapor atmosphere at 1000° C. can reduce impurity concentrations of hydrogen (H), nitrogen (N) and carbon (C), relative to the heat treatment 61 of the comparison example 1 or the heat treatment 62 of the comparison example 2. Here, if an under-layer of a polysilazane film is made of silicon (Si), water vapor ($H_2O$) diffuses to oxidize an Si substrate, so that a silicon oxide film collapses or an active region of a transistor is eroded, and thus, it is difficult to use the high temperature WET treatment according to the present invention. In this case, in the heat treatment 62 of the comparison example 2 of FIG. 6, a heat treatment (annealing) in inert gas atmosphere without oxidation is suggested as a densification treatment, but, as shown in FIG. 6, the heat treatment 62 has a higher impurity concentration in a polysilazane film than the high temperature WET treatment 63 according to the present invention.

However, as shown in FIG. 4, for example, when an under-layer of a polysilazane film is a silicon nitride film, although the high temperature WET treatment is performed, oxidation of an Si substrate can be suppressed. Thus, as a polysilazane heat treatment, the high temperature WET treatment (1000° C.) can be used, and thus, impurity concentrations in a polysilazane film can be effectively reduced. As such, the present invention is especially effective in embedding a polysilazane film into the groove part (refer to FIG. 4) under which a film without oxidation of an Si substrate is laid, for example, under which a silicon nitride film as a liner film is laid. A liner film is an under-layer film for a stress control and a adhesiveness improvement in a groove.

As described above, according to the heat treatment of the present invention, a silicon oxide film embedded in a groove part on a substrate can be further cured, and thus, etching resistance of the silicon oxide film embedded in the groove part can be improved.

According to the above-described substrate processing method, a polysilazane application film is cured through the first heat treatment process, and impurities included in polysilazane are effectively and easily removed through the second heat treatment process. In addition, the above-described substrate processing method is especially effective, like in a case where polysilazane is applied on a silicon nitride film formed on a substrate, in a case where the effect of the second heat treatment, for example, on oxidation of a substrate in a layer under a polysilazane film is small.

In addition, before the first heat treatment process, it is preferable that a heat treatment is performed at a temperature ranging from 100° C. to 250° C. and organic solvent included in polysilazane is evaporated. This heat treatment process may be performed, after polysilazane is applied on a substrate, as a part of a bake process on an applied film, before the substrate is loaded into the substrate process chamber.

While the embodiments of the present invention have been particularly described, various changes in form and details may be made without departing from the spirit and scope of the present invention.

In the above-described embodiments, the batch type vertical heat treatment apparatus is described, but the present invention may be also applied to a single wafer apparatus.

PREFERRED EMBODIMENTS OF THE PRESENT INVENTION

The present invention also includes the following embodiments.

(Supplementary Note 1)

According to a preferred embodiment of the present invention, there is provided a substrate processing method comprising: loading a substrate, on which polysilazane is applied, into a substrate process chamber; maintaining an inside of the substrate process chamber, into which the substrate is loaded, in water vapor atmosphere and depressurization atmosphere at a temperature ranging from 350° C. to 450° C.; performing a first heat treatment process on the substrate in a state where the inside of the substrate process chamber is maintained in the water vapor atmosphere and the depressurization atmosphere at the temperature ranging from 350° C. to 450° C.; next, increasing an inner temperature of the substrate process chamber from the temperature ranging from 350° C. to 450° C. in the first heat treatment process to a temperature ranging from 900° C. to 1000° C.; and performing a second heat treatment process on the substrate in a state where the inside of the substrate process chamber is maintained in water vapor atmosphere and depressurization atmosphere at the temperature ranging from 900° C. to 1000° C.

When the substrate processing method is configured as described above, an applied film of polysilazane is cured through the first heat treatment process, and impurities included in the polysilazane are effectively and easily removed through the second heat treatment process. In addition, since the first heat treatment process and the second heat treatment process are sequentially performed, the substrate processing method can have less heat treatment processes than a case where, between the first heat treatment process and the second heat treatment process, a middle heat treatment process is performed at a temperature between the treatment temperature of the first heat treatment process and the treatment temperature of the second heat treatment process.

(Supplementary Note 2)

The substrate processing method of Supplementary Note 1 may comprise, after the second heat treatment process, performing a third heat treatment process on the substrate in a state where the inside of the substrate process chamber is maintained in inert gas atmosphere and depressurization atmosphere at the temperature ranging from 900° C. to 1000° C.

When the substrate processing method is configured as described above, through the third heat treatment process, impurities are removed from the polysilazane film to achieve densification.

(Supplementary Note 3)

In the substrate processing method of Supplementary Note 1 or 2, before applying the polysilazane, a silicon nitride film may be formed on the substrate.

When the substrate processing method is configured as described above, an under-layer of the polysilazane film is the silicon nitride film, and thus, even when the second heat treatment process is performed at a high temperature, the oxidation of a silicon substrate can be suppressed.

(Supplementary Note 4)

According to another preferred embodiment of the present invention, there is provided a substrate processing apparatus comprising: a substrate process chamber configured to accommodate a substrate; a heater configured to heat the substrate accommodated in the substrate process chamber; a water vapor generator; a water vapor supply pipe configured to supply water vapor from the water vapor generator into the substrate process chamber; an exhaust pipe configured to exhaust atmosphere in the substrate process chamber; and a control part, wherein the control part executes a control to perform a first heat treatment process on the substrate in a state where an inside of the substrate process chamber is maintained in water vapor atmosphere and depressurization atmosphere at a temperature ranging from 350° C. to 450° C.; to increase an inner temperature of the substrate process chamber from the temperature ranging from 350° C. to 450° C. in the first heat treatment process to a temperature ranging from 900° C. to 1000° C.; to perform a second heat treatment process on the substrate in a state where the inside of the substrate process chamber is maintained in water vapor atmosphere and depressurization atmosphere at the temperature ranging from 900° C. to 1000° C.; and then, to perform a third heat treatment process on the substrate in a state where the inside of the substrate process chamber is maintained in inert gas atmosphere and depressurization atmosphere at the temperature ranging from 900° C. to 1000° C.

When the substrate processing apparatus is configured as described above, an applied film of polysilazane is cured through the first heat treatment process, and impurities included in the polysilazane are effectively and easily removed through the second heat treatment process, and impurities are removed from the polysilazane film to achieve densification through the third heat treatment process.

What is claimed is:

1. A substrate processing method comprising:
   loading a substrate, on which polysilazane is applied, into a substrate process chamber;
   maintaining an inside of the substrate process chamber, into which the substrate is loaded, in water vapor atmosphere and depressurization atmosphere at a temperature ranging from 350° C. to 450° C.;
   performing a first heat treatment process on the substrate in a state where the inside of the substrate process chamber is maintained in the water vapor atmosphere and the depressurization atmosphere at the temperature ranging from 350° C. to 450° C.;
   next, increasing an inner temperature of the substrate process chamber from the temperature ranging from 350° C. to 450° C. in the first heat treatment process to a temperature ranging from 900° C. to 1000° C.; and
   performing a second heat treatment process on the substrate in a state where the inside of the substrate process chamber is maintained in water vapor atmosphere and depressurization atmosphere at the temperature ranging from 900° C. to 1000° C.

2. The substrate processing method of claim 1, comprising, after the second heat treatment process, performing a third heat treatment process on the substrate in a state where the inside of the substrate process chamber is maintained in inert gas atmosphere and depressurization atmosphere at the temperature ranging from 900° C. to 1000° C.

3. The substrate processing method of claim 1, wherein, before applying the polysilazane, a silicon nitride film is formed on the substrate.

4. A substrate processing apparatus comprising:
   a substrate process chamber configured to accommodate a substrate;
   a heater configured to heat the substrate accommodated in the substrate process chamber;
   a water vapor generator;
   a water vapor supply pipe configured to supply water vapor from the water vapor generator into the substrate process chamber;
   an exhaust pipe configured to exhaust atmosphere in the substrate process chamber; and
   a control part,
   wherein the control part executes a control to perform a first heat treatment process on the substrate in a state where an inside of the substrate process chamber is maintained in water vapor atmosphere and depressurization atmosphere at a temperature ranging from 350° C. to 450° C.; to increase an inner temperature of the substrate process chamber from the temperature ranging from 350° C. to 450° C. in the first heat treatment process to a temperature ranging from 900° C. to 1000° C.; to perform a second heat treatment process on the substrate in a state where the inside of the substrate process chamber is maintained in water vapor atmosphere and depressurization atmosphere at the temperature ranging from 900° C. to 1000° C.; and then, to perform a third heat treatment process on the substrate in a state where the inside of the substrate process chamber is maintained in inert gas atmosphere and depressurization atmosphere at the temperature ranging from 900° C. to 1000° C.

* * * * *